(12) United States Patent
Kim

(10) Patent No.: US 7,151,022 B2
(45) Date of Patent: Dec. 19, 2006

(54) METHODS FOR FORMING SHALLOW TRENCH ISOLATION

(75) Inventor: Jae Young Kim, Seoul (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 112 days.

(21) Appl. No.: 10/900,685

(22) Filed: Jul. 28, 2004

(65) Prior Publication Data

US 2005/0026376 A1     Feb. 3, 2005

(30) Foreign Application Priority Data

Jul. 31, 2003   (KR) ................. 10-2003-0052942

(51) Int. Cl.
  *H01L 21/8238*   (2006.01)
(52) U.S. Cl. .................. 438/218; 438/221; 438/296
(58) Field of Classification Search ........ 438/195–199, 438/218–219, 221, 248, 294–296
See application file for complete search history.

(56) References Cited

U.S. PATENT DOCUMENTS 5,830,797 A * 11/1998 Cleeves ............... 438/296
6,107,143 A    8/2000 Park et al.
6,239,003 B1 * 5/2001 Rao et al. ............... 438/439
6,309,948 B1   10/2001 Lin et al.
6,417,054 B1   7/2002 Zheng et al.
6,432,816 B1   8/2002 Kim et al.

* cited by examiner

*Primary Examiner*—Thanhha S. Pham
(74) *Attorney, Agent, or Firm*—Saliwanchik, Lloyd & Saliwanchik

(57) ABSTRACT

Methods of forming a shallow trench isolation structure are disclosed. A disclosed method comprises: depositing pad oxide over a silicon substrate; implanting ions; removing a portion of the pad oxide using an STI pattern; depositing a polysilicon layer; implanting ions to make N+ polysilicon; depositing a bottom anti-reflection coat (BARC) over the polysilicon layer; forming a gate pattern over the BARC; etching the polysilicon layer to make a gate and form a device isolation area; depositing a nitride layer over the gate and the device isolation area; etching the nitride layer; filling the device isolation area with photoresist; forming silicide; and depositing an oxide layer and performing a planarization process.

10 Claims, 5 Drawing Sheets

METHODS FOR FORMING SHALLOW TRENCH ISOLATION

FIELD OF THE DISCLOSURE

The present disclosure relates to semiconductor fabrication and, more particularly, to methods for forming shallow trench isolation structures.

BACKGROUND

A conventional method of isolating semiconductor devices includes performing a LOCOS (local oxidation of silicon) process which achieves selective oxidation by using a nitride layer. More specifically, the LOCOS process thermally oxidizes a silicon wafer while using the nitride layer as a mask. Such a LOCOS process can reduce the stress of the oxide layer in a device and produce an oxide layer of good quality. However, the LOCOS process has limitations in manufacturing fine pattern semiconductor devices and causes bird's beak because the area of the device isolation region formed by the LOCOS process is relatively large.

To obviate these problems, a shallow trench isolation (hereinafter referred to as "STI") process has been developed as an alternative technology. The STI method forms trenches within a silicon wafer and then fills them with an insulating material, thereby making device isolation structures of small size. Accordingly, the STI process is widely used to manufacture fine pattern devices.

Kim et al., U.S. Pat. No. 6,432,816, describes a method for fabricating a semiconductor device which can optimize an electrical property of a high integration device by preventing a device isolation film from being (a) damaged due to misalignment in a lithography process or (b) overetched during the etch process. In the above-mentioned patent, a protective film for protecting a device isolation film is formed on the device isolation film for use during a contact hole formation process.

Zheong et al., U.S. Pat. No. 6,417,054, describes a method for fabricating a self-aligned S/D CMOS device on an insulated layer by forming a trench along side the STI and filling the trench with oxide.

Lin et al., U.S. Pat. No. 6,309,948, describes a method for forming a semiconductor structure on an active area mesa with minimal loss of field oxide deposited in isolation trenches adjacent the mesa. In that method, the trench insulating material is protected by an etch barrier layer having at least a partial resistance to etchants used in further device processing steps.

Park et al., U.S. Pat. No. 6,107,143, describes a method for forming a trench isolation structure in an integrated circuit having high integration density. Park et al. use the difference in etching rate between (1) a sidewall-insulating layer formed along the sidewall and bottom of a trench and (2) a trench-insulating layer deposited in the trench to prevent the sidewall-insulating layer from being damaged during wet etching processes, thereby making an interface between the substrate, sidewall-insulating layer, and gate oxide more reliable.

FIG. 1 is a cross-sectional view illustrating a prior art semiconductor device having a device isolation structure. A conventional STI process comprises forming a trench by dry-etching a semiconductor substrate; curing damage due to the dry-etching; creating an oxide layer by thermally oxidizing the trench to enhance interface characteristics and edge rounding features of the active and device isolation regions; depositing a thick insulating layer all over the semiconductor substrate so as to completely fill the trench; and planarizing the semiconductor substrate using a chemical mechanical polishing process. Then, gate lines are formed on the resulting substrate.

However, the conventional STI process may cause several problems due to the difference in height between a field region 20 and a moat region 30. For example, polysilicon residues deposited on an area 1 between the field region 20 and the moat region 30 may cause leakage current. In addition, if a void 2 is created in the field region 20, the polysilicon residues infiltrate into the void to cause leakage current. On the other hand, if the field region 20 is lower in height than the moat region 30, a moat pit is created on the moat region 30 which is first opened during a polysilicon etching process. In the event of contact pattern misalignment, loss of the oxide 3 occurs on the field region 20 to thereby cause a leakage failure. Moreover, it is very difficult to control a critical dimension (hereinafter referred to as "CD") during etching and patterning processes because of the difference in height between the field region and the moat region.

DETAILED DESCRIPTION

Figure 1:
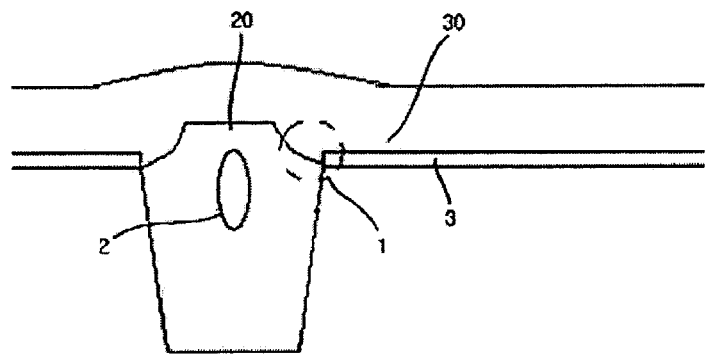
FIG. 1 is a cross-sectional view illustrating a prior art semiconductor device having a device isolation structure.
Figure 2:
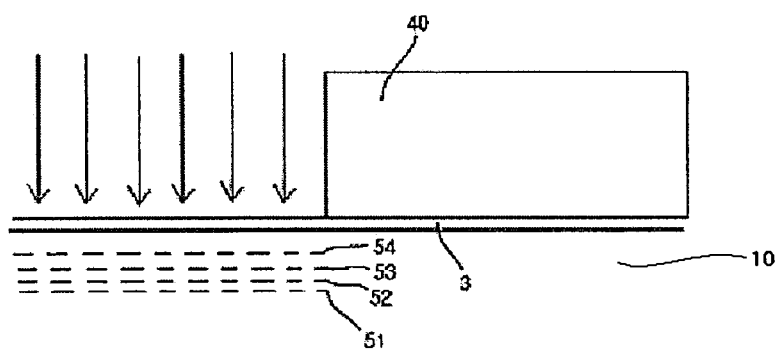
FIGS. 2 through 13 are cross-sectional views illustrating an example process for making an STI of a semiconductor device constructed in accordance with the teachings of the present invention.

Referring to FIG. 2, a pad oxide 3 is deposited over a silicon substrate 10. An N-channel threshold voltage (hereinafter referred to as "VTN") pattern 40 is then formed over the pad oxide 3. Next, an ion implantation (VTN implant) 54 is performed to adjust a threshold voltage (hereinafter referred to as "Vt"). An ion implantation (N-channel punchthrough (NCH P/T) implant) 53 is conducted to prevent punchthrough. An ion implantation (N-channel channel stop (NCH C/S) implant) 52 is performed to isolate a field, increase Vt, and decrease leakage current. Then, a high-energy ion implantation (P-well retrograde high energy (N-well MEV) implant) 51 is conducted to make a P-type retrograde wall.

Figure 3:
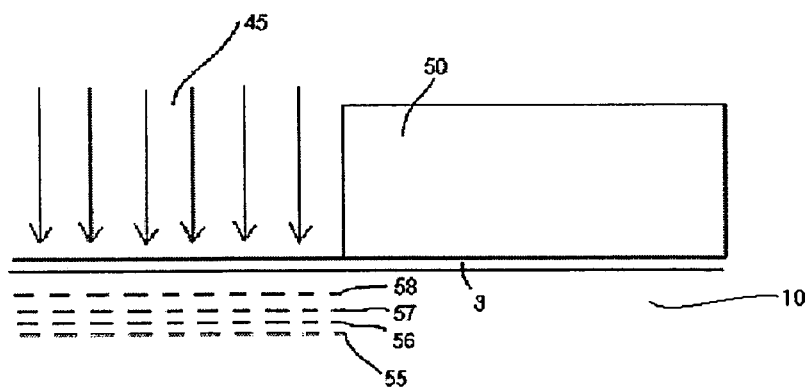

Referring to FIG. 3, a P-channel threshold voltage (hereinafter referred to as "VTP") pattern 50 is formed over the resulting structure. Next, an ion implantation (VTP implant) 58 is performed to adjust Vt. An ion implantation (P-channel punchthrough (PCH P/T) implant) 57 is conducted to prevent punchthrough. An ion implantation (P-channel channel stop (PCH C/S) implant) 56 is performed to isolate a field, increase Vt, and decrease leakage current. Then, a high-energy ion implantation (N-well retrograde high energy (N-well MEV) implant) 55 is performed to form an N-type retrograde wall.

Figure 4:
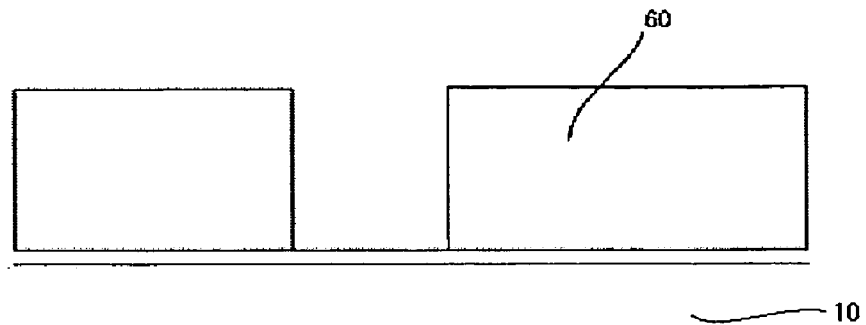
Figure 5:
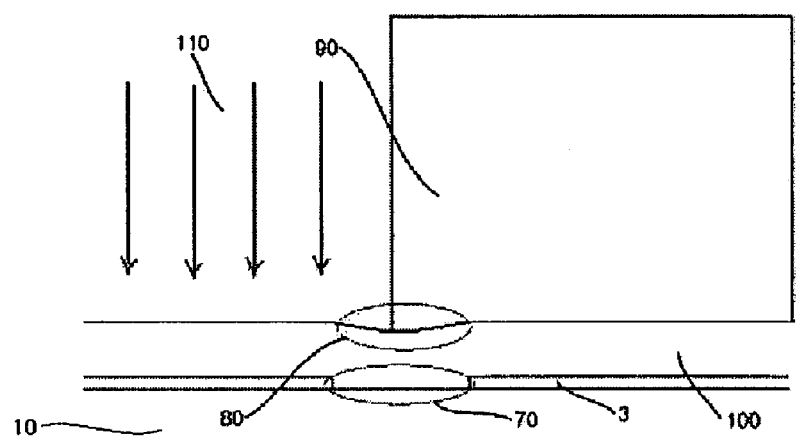

Referring to FIG. 4, some part of the pad oxide 3 is removed using an STI pattern 60 to form an open area 70 in the pad oxide (see FIG. 5).

Referring to FIG. 5, the STI pattern 60 is removed and a polysilicon layer 100 is deposited over the resulting structure. The thickness of the polysilicon layer 100 is preferably 2.7 k Å. The polysilicon area 80 located over the open area 70 of the pad oxide is subsided lower than the surrounding area. A photoresist pattern 90 to implant ions to make N+ polysilicon is then formed over the polysilicon layer 100. Next, an N+ ion implantation 110 is performed.

Figure 6:
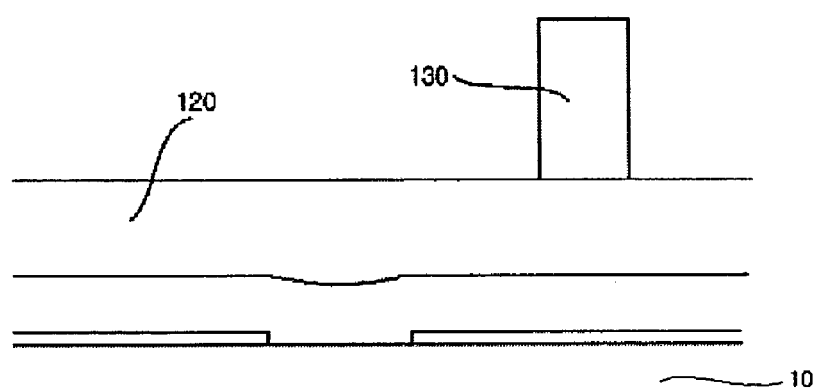

Referring to FIG. 6, a bottom anti-reflect coat 120 (hereinafter referred to as "BARC") is deposited over the resulting structure. A photoresist pattern 130 is formed over the BARC to make a gate.

Figure 7:
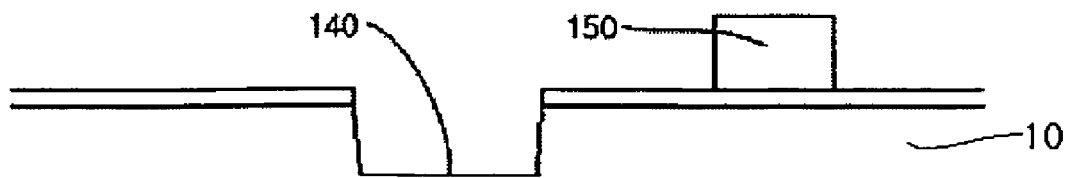

Referring to FIG. 7, the BARC and the polysilicon layer are etched using a photoresist pattern as a mask to form a gate 150. As a result of this process, silicon loss 140 occurs in the open area 70 in the pad oxide to form the STI. To make the STI uniform, an end of point (hereinafter referred to as "EOP") system can be used.

Figure 8:
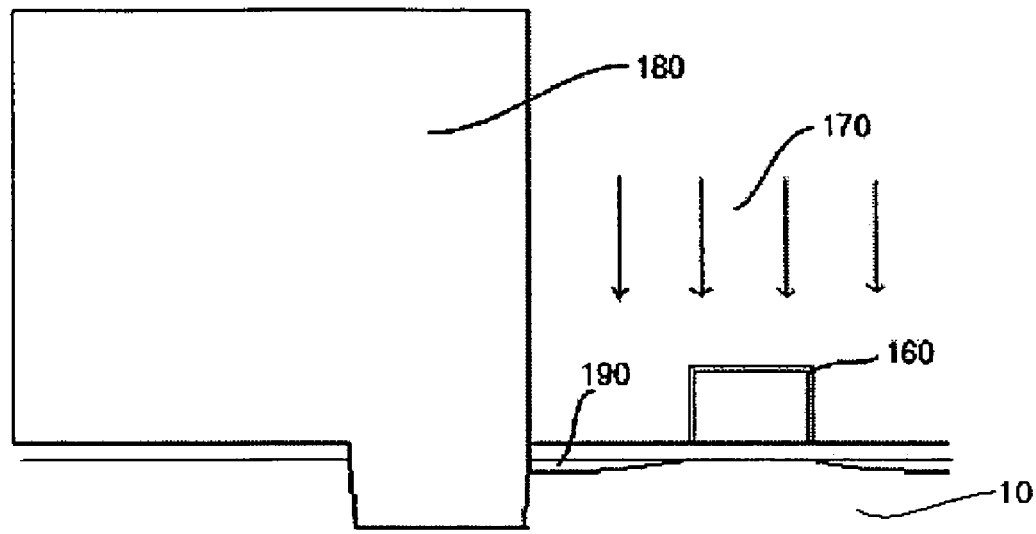

Referring to FIG. 8, a native oxide layer 160 is formed on the top and sidewalls of the gate 150 to complement a weak oxide layer at the ends of the gate. Next, a photoresist pattern 180 is formed over the resulting structure and an ion implantation 170 is performed to create a lightly doped drain (hereinafter referred to as "LDD") 190.

Figure 9:
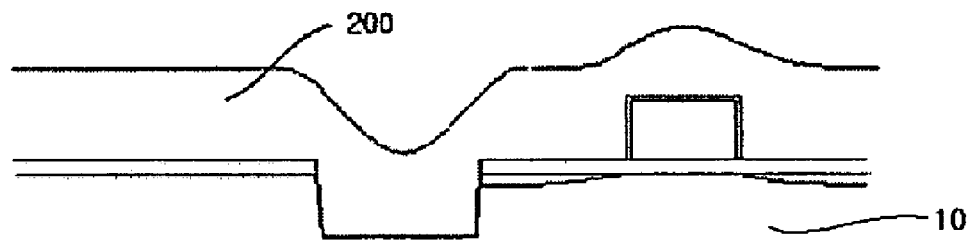

Referring to FIG. 9, the photoresist pattern 180 is removed and a nitride layer 200 is deposited over the resulting structure including the gate 150 and the silicon loss area 70. The thickness of the deposited nitride layer 200 is preferably 1.2 k Å. Here, the nitride layer on the silicon loss area 70 is subsided lower than the surrounding areas.

Figure 10:
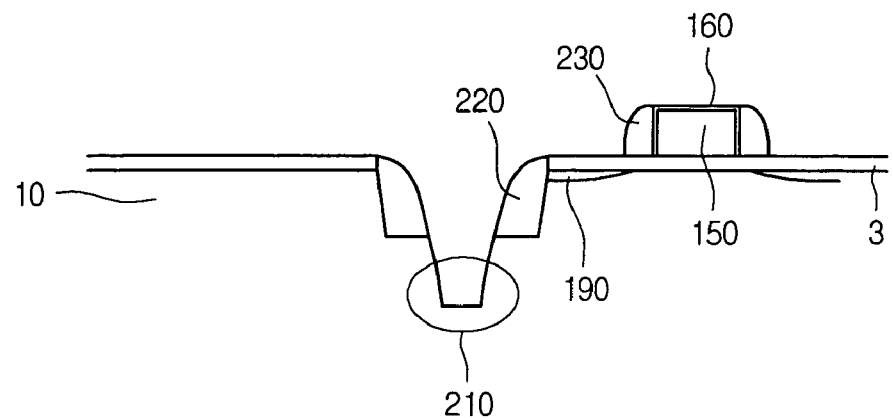

Referring to FIG. 10, the nitride layer is etched to form spacers 230 on the sidewalls of the gate 150 and spacers 220 on the sidewalls of the silicon loss area 70. The silicon loss area 210 is deepened to form the STI because the subsided nitride layer on the silicon loss area is first opened during etching.

Figure 11:
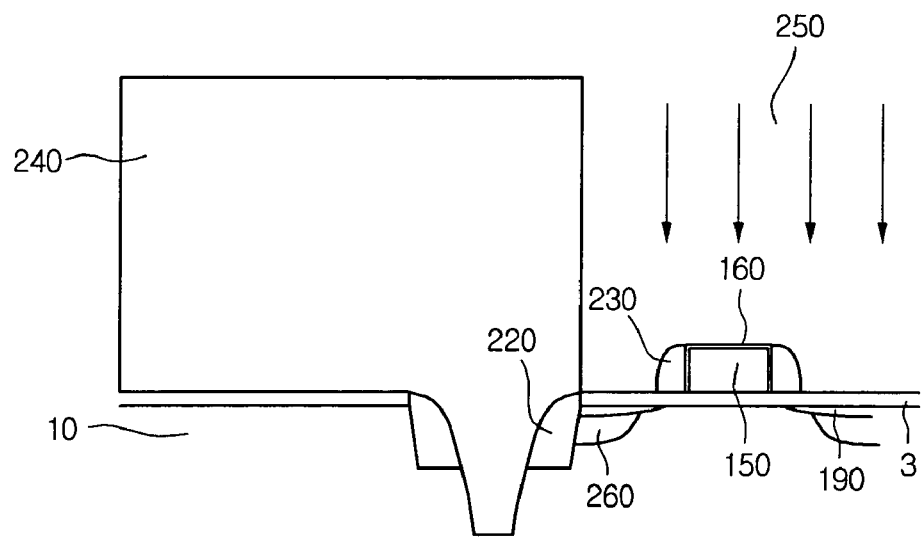

Referring to FIG. 11, a pattern 240 to make the source/drain junction 260 is formed. Ion implantation 250 is performed using the pattern 240 as a mask.

Figure 12:
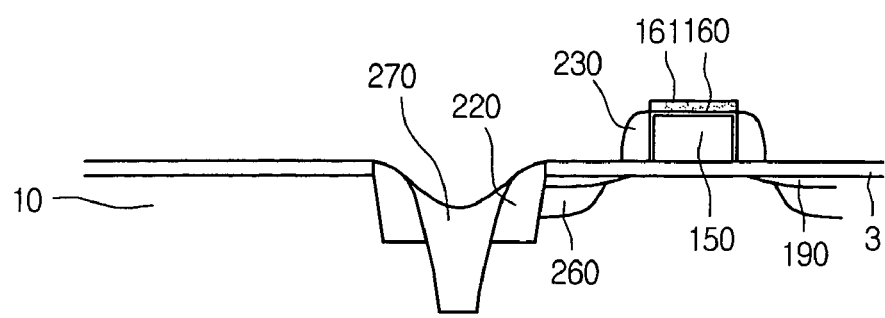

Referring to FIG. 12, the STI is filled with photoresist 270 and, then, a silicide process is performed. In the silicide process, a metal layer is deposited over the structure including the STI filled with the photoresist 270 and a thermal treatment is conducted for the metal layer. Then, the unreacted metal layer is removed and a stabilization process is performed resulting in silicide layer 161.

Figure 13:
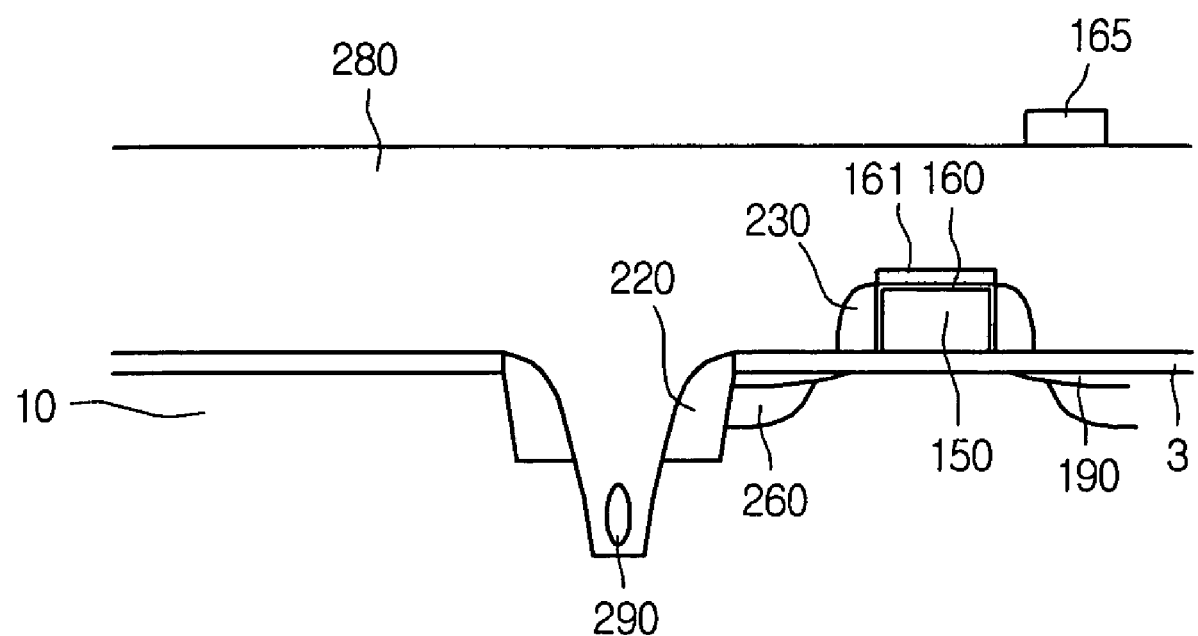

Referring to FIG. 13, an oxide layer 280 is deposited over the resulting structure and, then, a chemical mechanical polishing process is performed. Here, the oxide layer 280 is used to fill the STI, and to function as a pre-metal dielectric (hereinafter referred to as "PMD"). A void 290 maybe formed on the bottom area, but leakage current is not generated and, the dielectric constant is increased because the deposition of polysilicon and the etching process have already been performed. Next, gate input terminals and gate lines 165 are formed over the top of the resulting structure.

The disclosed STI formation methods only remove a portion of a pad oxide layer using an STI pattern and, then, perform ion implantation processes using VTN and VTP patterns to make the device isolation structure. Therefore, this method can control the deposition of polysilicon residues due to the difference in height between the field region and the moat region, thereby preventing the occurrence of leakage current. Moreover, although a void may be formed in the field region, a leakage current due to the penetration of polysilicon residues into the void can be avoided. In addition, a moat pit is not formed on the moat region, which is first opened during polysilicon etching, even though the height of the field region is lower than that of the moat region. Also, the disclosed methods can obviate damage to the field region due to misalignment during contact etching because nitride spacers are formed on the sidewalls of the STI.

From the foregoing, persons of ordinary skill in the art will appreciate that the above methods for forming an STI structure have been disclosed. A disclosed method of forming an STI structure can prevent the occurrence of leakage current due to polysilicon residues deposited on the area between a field region and a moat region, the formation of a moat pit in the moat region, and damage to the field region due to misalignment during a contact etching process.

A disclosed method comprises simultaneously making a transistor and a device isolation structure in an uncompleted topology state and, then, forming gate lines including input gate terminals on the resulting structure, instead of making a device isolation structure prior to fabricating the transistor.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a shallow trench isolation structure, the method comprising:
   depositing pad oxide over a silicon substrate;
   implanting ions into the silicon substrate;
   removing a portion of the pad oxide using an STI pattern to expose a portion of the silicon subtrate;
   depositing a polysilicon layer over the pad oxide and the portion of the silicon substrate exposed from removing the portion of the pad oxide;
   implanting ions in the polysilicon layer to make N+ polysilicon;
   depositing a bottom anti-reflection coat (BARC) over the polysilicon layer;
   forming a gate pattern over the BARC;
   etching the polysilicon layer to make a gate and form a shallow trench isolation (STI area, wherein etching the polysilicon layer further forms a device isolation area by etching the portion of the silicon substrate exposed from removing the portion of the pad oxide resulting in forming the STI area according to the STI pattern;
   depositing a nitride layer over the silicon substrate;
   etching the nitride layer;
   filling the device isolation area with photoresist;
   forming silicide over a portion of the silicon substrate; and
   depositing an oxide layer over the silicon substrate and performing a planarization process.

2. A method as defined in claim 1, wherein implanting ions into the silicon substrate comprises:
   forming a VTN pattern over the silicon substrate;
   sequentially performing a VTN implant, an N-channel punchthrough implant, an N-channel channel stop implant, and a P-well retrograde high-energy implant into the silicon substrate;
   forming a VTP pattern over the silicon substrate; and
   sequentially performing a VTP implant, a P-channel punchthrough implant, a P-channel channel stop implant, and an N-well retrograde high-energy implant into the silicon substrate.

3. A method as defined in claim 1, wherein etching the polysilicon layer causes silicon loss which forms the device isolation area.

4. A method as defined in claim 3, further comprising using an EOP system to ensure the silicon loss produces a substantially uniform STI.

5. A method as defined in claim 1, wherein the nitride layer is etched to form spacers on the sidewalls of the gate and the STI area.

6. A method as defined in claim 5, wherein etching the nitride layer causes further silicon loss in the STI area by opening the nitride layer over the STI area.

7. A method as defined in claim 1, wherein the oxide layer fills the STI area and simultaneously functions as a PMD.

8. A method as defined in claim 1, wherein depositing the oxide layer produces at least one void in a bottom area of the STI area, thereby increasing a dielectric constant.

9. A method of as defined in claim 1 further comprising:
forming gate lines including input gate terminals on the oxide layer.

10. A method for forming a shallow trench isolation structure, the method comprising:

depositing pad oxide over a silicon substrate;

removing a portion of the pad oxide using an STI pattern thereby exposing a portion of the silicon substrate;

depositing a polysilicon layer over the pad oxide and the portion of the silicon substrate exposed from removing the portion of the pad oxide;

forming a gate pattern over the polysilicon layer; and etching the polysilicon layer to simultaneously make a gate and form a device isolation area, wherein etching the polysilicon layer comprises further the portion of the silicon substrate exposed by removing the portion of the pad oxide using the STI pattern.

* * * * *

UNITED STATES PATENT AND TRADEMARK OFFICE
CERTIFICATE OF CORRECTION

PATENT NO.      : 7,151,022 B2
APPLICATION NO. : 10/900685
DATED           : December 19, 2006
INVENTOR(S)     : Jae Young Kim It is certified that error appears in the above-identified patent and that said Letters Patent is hereby corrected as shown below:

<u>Column 3,</u>
Line 45, "a void 290 maybe" should read --a void 290 may be--.

<u>Column 4,</u>
Line 37, "shallow trench isolation (STI area," should read
    --shallow trench isolation (STI) area,--.

<u>Column 6,</u>
Line 12, "comprises further the portion" should read
    --comprises further etching the portion--.

Signed and Sealed this

Tenth Day of April, 2007

JON W. DUDAS
*Director of the United States Patent and Trademark Office*